(12) United States Patent
Bungo et al.

(10) Patent No.: US 10,739,085 B2
(45) Date of Patent: Aug. 11, 2020

(54) LAMINATED HEAT SINK CORE

(71) Applicant: T.RAD Co., Ltd., Tokyo (JP)

(72) Inventors: Takuya Bungo, Tokyo (JP); Atsushi Okubo, Tokyo (JP); Taiji Sakai, Tokyo (JP)

(73) Assignee: T.RAD Co., Ltd., Tokyo (JP)

( * ) Notice: Subject to any disclaimer, the term of this patent is extended or adjusted under 35 U.S.C. 154(b) by 33 days.

(21) Appl. No.: 16/310,512

(22) PCT Filed: Jul. 5, 2017

(86) PCT No.: PCT/JP2017/025466
§ 371 (c)(1),
(2) Date: Dec. 17, 2018

(87) PCT Pub. No.: WO2018/012558
PCT Pub. Date: Jan. 18, 2018

(65) Prior Publication Data
US 2019/0249934 A1 Aug. 15, 2019

(30) Foreign Application Priority Data

Jul. 11, 2016 (JP) ................................ 2016-136808

(51) Int. Cl.
*F28F 3/08* (2006.01)
*H01L 23/473* (2006.01)
*H05K 7/20* (2006.01)
*F28D 9/00* (2006.01)

(52) U.S. Cl.
CPC ............ *F28F 3/086* (2013.01); *F28D 9/0031* (2013.01); *H01L 23/473* (2013.01); *H05K 7/20* (2013.01); *F28F 2210/10* (2013.01)

(58) Field of Classification Search
CPC ...... F28F 3/10; F28F 3/048; F28F 3/05; F28F 3/04; F28F 17/005; F28F 3/086; F28F 2210/10; F28F 1/126; F28F 3/08; F28D 1/0333; F28D 2021/0085; F28D 9/0031; H05K 7/20254
See application file for complete search history.

(56) References Cited

U.S. PATENT DOCUMENTS

| 6,401,804 B1 * | 6/2002 | Shimoya ............... F28D 1/0333 165/133 |
| 10,215,497 B2 | 2/2019 | Noishiki et al. |
| 2007/0246204 A1 | 10/2007 | Lai |

(Continued)

FOREIGN PATENT DOCUMENTS

| JP | 2007-012719 A | 1/2007 |
| JP | 2007-242724 A | 9/2007 |
| JP | 2012-018966 A | 1/2012 |

(Continued)

OTHER PUBLICATIONS

JP-2013235967-A translation.*

*Primary Examiner* — Elizabeth J Martin
(74) *Attorney, Agent, or Firm* — Norris McLaughlin, P.A.

(57) ABSTRACT

Conditions are found for a heat sink having the highest heat exchange performance on the basis of mutual relationship among thickness of each plate, slit pitch, and horizontal rib, in a laminated heat sink core in which numerous parallel slits are punched in a plate, slender vertical ribs are disposed therebetween and the plate is laminated.

3 Claims, 9 Drawing Sheets

(56) References Cited

U.S. PATENT DOCUMENTS

2017/0234622 A1* 8/2017 Mizushita ............. F28D 9/0037
165/166

FOREIGN PATENT DOCUMENTS

| JP | 2013-030713 A | 2/2013 |
| JP | 2013-235967 A | 11/2013 |
| JP | 2013235967 A * | 11/2013 |
| JP | 2014-033063 A | 2/2014 |
| WO | 2015/083728 A1 | 6/2015 |

* cited by examiner

LAMINATED HEAT SINK CORE

TECHNICAL FIELD

The present invention relates to a laminated heat sink core in which metal plates having numerous slits are laminated and a refrigerant is circulated through the slits.

BACKGROUND ART

The present applicant has already proposed a plate type heat sink described in Patent Literature 1 below.

In this case, numerous slits are punched by press in a metal plate, which is formed into a flat plate, a core is formed by a laminated body of each of plates, and an end plate is disposed at both ends in the lamination direction of the core. Furthermore, each plate has a frame part at the outer periphery thereof, numerous slender ribs are formed integrally between respective slits, and a manifold is disposed at both end parts of each slit. Then, a refrigerant is circulated to each of slits, an exothermic body composed of electronic parts is disposed on the outer surface of the end plate, and the generated heat is removed with the refrigerant.

CITATION LIST

Patent Literature

PTL 1: Japanese Patent Laid-Open No. 2012-018966
PTL 2: Japanese Patent Laid-Open No. 2014-033063

SUMMARY OF INVENTION

Technical Problem

For the forgoing plate type heat sink, one that is compact with high performance has been requested.

In a laminated heat sink core in which numerous parallel slits are punched in a plate, slender vertical ribs are disposed therebetween and the plate is laminated, the present inventor has examined intensively and found conditions for a heat sink having the highest heat exchange performance on the basis of mutual relationship among the thickness of each plate, slit pitch, and a horizontal rib.

Solution to Problem

The present invention described in claim 1 is a laminated heat sink core, including:
laminated plural plates 4, in which numerous parallel slits 1 are formed, and numerous parallel slender vertical ribs 2 and a horizontal rib 3 interlinking adjacent respective vertical ribs 2 are formed therebetween;
a thickness T of each plate 4 is 0.8 mm to 1.6 mm;
each of plates 4 is joined in a state where each of plates 4 is laminated while each of vertical ribs 2 adjacent in a lamination direction is matched with each other in the lamination direction and the horizontal ribs 3 are matched with each other alternately in the lamination direction, in each of plates 4;
each of horizontal ribs 3 is disposed in a zigzag pattern in a horizontal cross-section orthogonal to the horizontal rib 3; and
a refrigerant meanders in an extension direction of the vertical rib 2 in the lamination direction between each of the horizontal ribs 3 of the laminated plates 4, wherein formulae below are satisfied, where T is the thickness of each plate 4, P is a pitch between the horizontal ribs 3 facing a circulation direction of the refrigerant, B is a length in the circulation direction of the horizontal rib 3, and A is a distance in the circulation direction between the horizontal ribs 3 adjacent in the zigzag pattern,
$P/T=3.0$ to 6.0, and
$A/P=0.15$ to 0.37
where $P=2A+2B$.

The present invention described in claim 2 is the laminated heat sink core according to claim 1, wherein
$A/P=0.17$ to 0.32.

The present invention described in claim 3 is the laminated heat sink core according to claim 1, wherein
$A/P=0.21$ to 0.29.

Advantageous Effects of Invention

The laminated heat sink core of the present invention is a laminated heat sink core that satisfies respective formulae of $$P=2A+2B, P/T=3.0 \text{ to } 6.0 \text{ and } A/P=0.15 \text{ to } 0.37$$

where a thickness T of each plate 4 is 0.8 mm to 1.6 mm, P is the pitch between the horizontal ribs 3 facing the circulation direction of a refrigerant, B is the length in the circulation direction of the horizontal rib 3, and A is the distance in the circulation direction between the horizontal ribs 3 adjacent in the zigzag pattern, and therefore a ratio of equivalent heat transfer coefficient/pressure loss falls in the range of 80% or more of an optimized value. Accordingly a heat sink with high heat exchange performance can be provided. That is, as a consequence of the setting of A/P in the above-described range, a thermal boundary layer is reduced to improve heat transmission, and rapid deflection of a refrigerant around the horizontal rib is suppressed and a pressure loss is reduced to cause a good ratio of the heat transfer coefficient relative to the pressure loss.

DESCRIPTION OF EMBODIMENTS

Next, on the basis of the drawings, embodiments of the present invention will be explained.

Example 1

Figure 1:
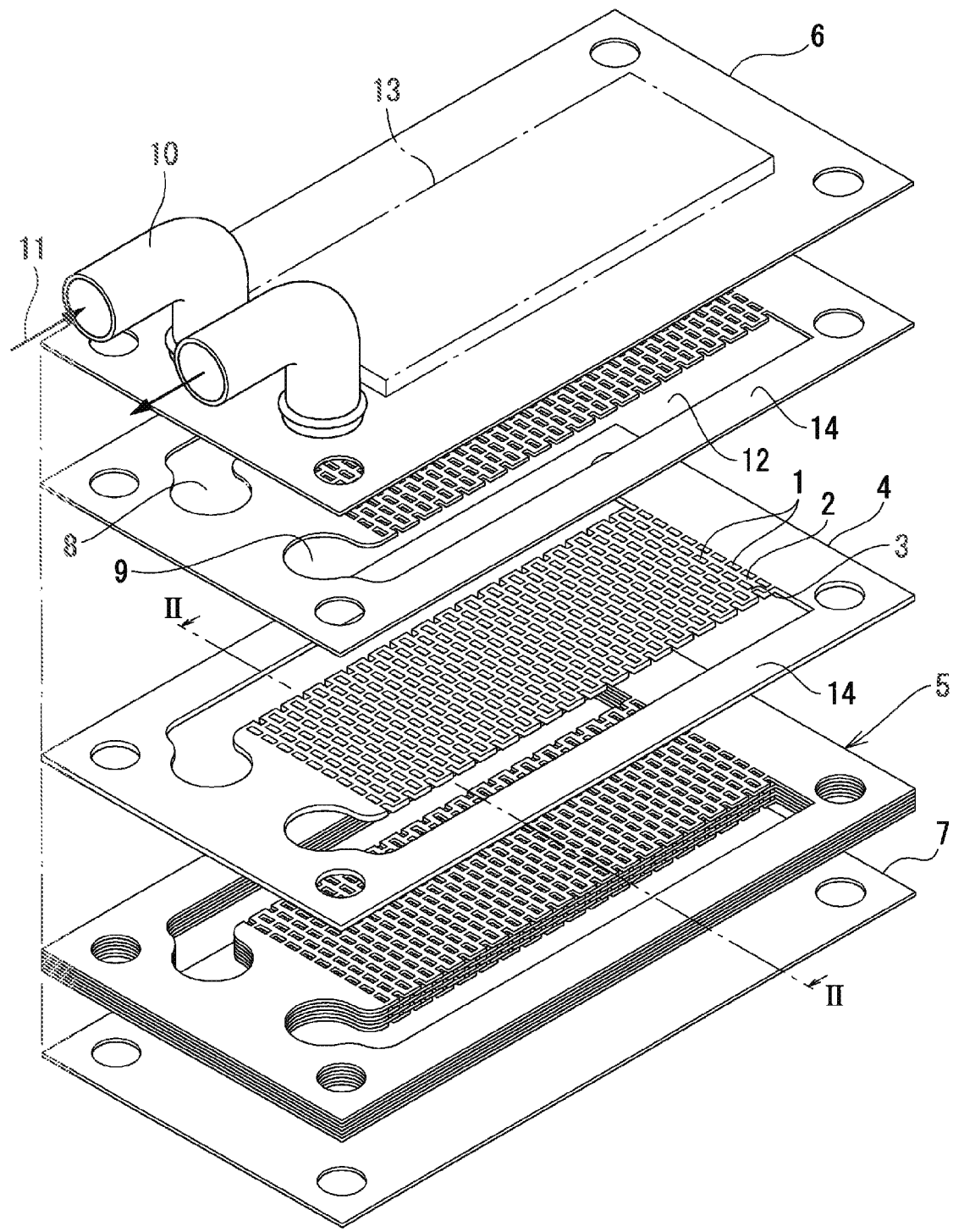
FIG. 1 illustrates an exploded perspective view of a laminated heat sink in Example 1 of the present invention.
Figure 2:
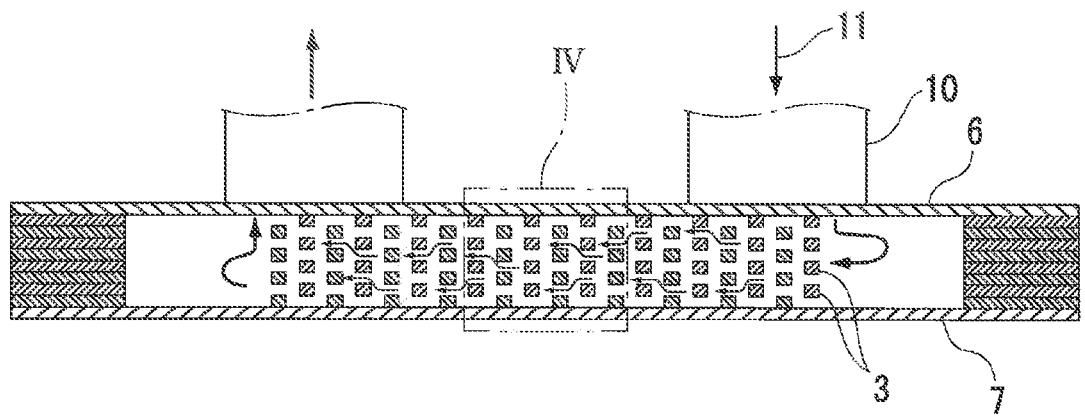
FIG. 2 illustrates a cross-sectional view as viewed from the arrow II-II in FIG. 1.
Figure 3:
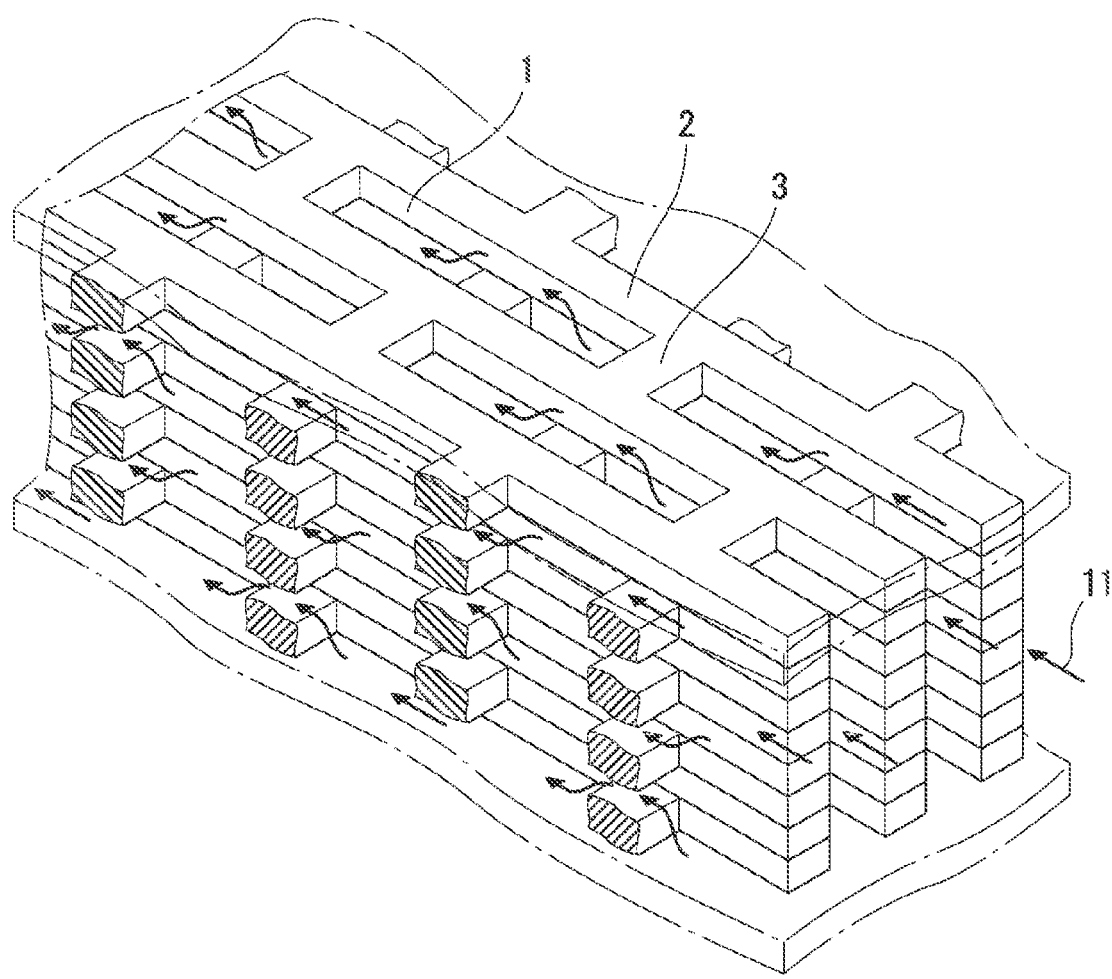
FIG. 3 is an explanatory view showing a flow of a refrigerant in a core of the heat sink.
Figure 4:
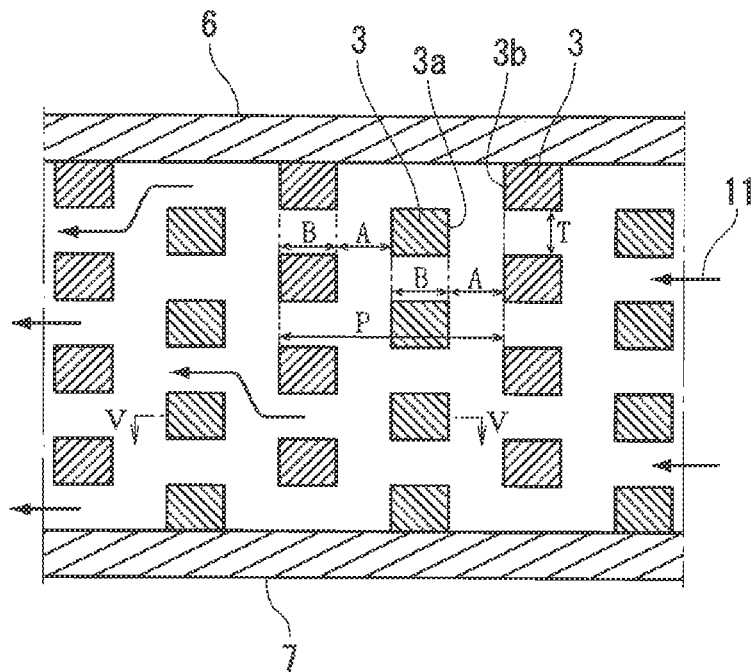
FIG. 4 illustrates an enlarged view of a part IV in FIG. 2.
Figure 5:
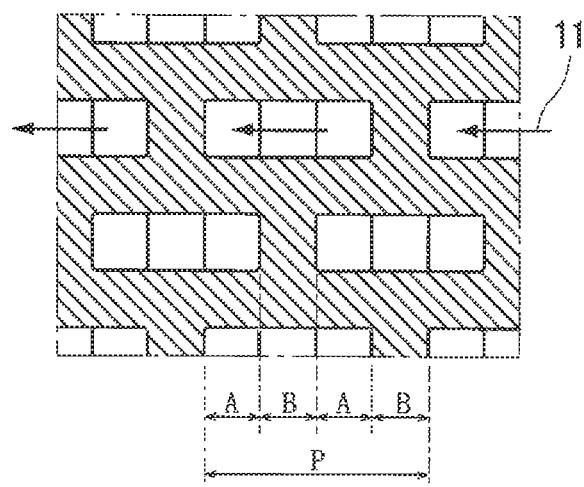
FIG. 5 illustrates a cross-sectional view as viewed from the arrow V-V in FIG. 4.

FIGS. 1 to 5 illustrate a laminated heat sink in Example 1 of the present invention, in which FIG. 1 illustrates an exploded perspective view thereof, FIG. 2 illustrates a cross-sectional view as viewed from the arrow II-II in FIG. 1, and FIG. 3 illustrates an explanatory view showing the flow of a refrigerant in a core of the heat sink. Moreover, FIG. 4 illustrates the enlarged view of the part IV in FIG. 2, and FIG. 5 illustrates a cross-sectional view as viewed from the arrow V-V in FIG. 4.

In this heat sink, a laminated body of plural flat plates 4 configures a core 5, a top plate 6 and a lower end plate 7 are disposed at both upper and lower ends, and each plate 4 is joined integrally by brazing.

In each of plates 4, numerous parallel slits 1 in the same shape are punched at constant intervals, and, between these slits 1, numerous and slender vertical or longitudinal ribs 2 parallel to each other are formed. Furthermore, the adjacent vertical ribs 2 are interlinked with a horizontal or transverse rib 3. The pitch of the horizontal ribs 3 is the same as the pitch of the slits 1. The thickness T of each plate is 0.8 mm to 1.6 mm.

A frame part 14 is provided for each plate 4 at the outer periphery thereof and in the frame part 14, as shown in FIG. 1, a pair of manifolds 12 are formed at both ends in the longitudinal direction of the vertical rib 2. In each plate 4, the vertical ribs 2 adjacent to each other in the lamination direction match in the lamination direction with each other and, as shown in a horizontal cross-section in FIG. 4, the horizontal ribs 3 in each of plates 4 match with each other alternately in the lamination direction of plates. Furthermore, in the drawing, each of the horizontal ribs 3 is disposed in a zigzag pattern.

The top plate 6 and the lower end plate 7 have an outer periphery that approximately matches the outer periphery of the frame part 14 of each plate 4, and a pair of pipes 10 is provided for the top plate 6. The pipe 10 on one side is communicated with an inlet 8 of each plate 4, and the pipe 10 on the other side is communicated with an outlet 9 of each plate 4. For each of inlets 8 and outlets 9, the manifold 12 that is communicated with these is provided. Respective parts are integrally joined with a brazing material. As each plate 4, the top plate 6 and the lower end plate 7, the use of plates having at least one surface clad with the brazing material is preferable.

Furthermore, to the outer surface of the top plate 6 and/or the lower end plate 7, an exothermic body 13 is attached and a refrigerant 11 is led to the manifold 12 from one of the pipes 10 via the inlet 8 of each plate 4.

The refrigerant 11 is led, as shown in FIGS. 1 to 3, to the slit 1 of each plate 4 from the manifold 12 (FIG. 1) while meandering as in FIG. 3 in the lamination direction along the horizontal rib 3, circulates in the extension direction of the vertical rib 2, and flows out to the manifold 12 on the other side.

As the refrigerant 11, as an example, cooling water can be used.

Then, heat generated from the exothermic body 13 attached to the outer surface of the top plate 6 is transmitted to the refrigerant 11 via the top plate 6 and each plate 4.

In such a laminated heat sink core, in a case where the thickness T of the plate 4 is 0.8 mm to 1.6 mm, a pitch of a flow path formed in a refrigerant circulation direction is P in FIG. 4, a length in the refrigerant circulation direction of the horizontal rib 3 is B and a distance in the circulation direction between an upstream side end surface 3a of each horizontal rib 3 and a downstream side end surface 3b of the other horizontal rib 3 adjacent to each other in the zigzag pattern is A, these parameters fulfil following formulae.

P/T=3.0 to 6.0 and
A/P=0.15 to 0.37
where, P=2A+2B.

FIG. 4 illustrates the enlarged view of the part IV in FIG. 2. In this example, eight plates 4 are laminated between a pair of the top plates 6 and the lower end plate 7. In each plate 4, the slit 1 is disposed numerously in the circulation direction of the refrigerant 11 by press molding.

The slits 1 are numerously formed with a pitch P in each plate 4, and the slits 1 exist, as shown in FIG. 3, between the vertical ribs 2 disposed in parallel to each other in the longitudinal direction and the horizontal rib 3 interlinking between the respective vertical ribs 2. Each of the vertical ribs 2 matches with each other in the lamination direction.

Moreover, each horizontal rib 3 matches with each other in the lamination direction for every other plate 4. Then, the length in the refrigerant circulation direction of the horizontal rib 3 is set to B. Moreover, a distance in the refrigerant circulation direction between the upstream side end surface 3a of the horizontal rib 3 and the downstream side end surface 3b of the horizontal rib 3 adjacent in the zigzag pattern to the upstream side end surface 3a is set to A. Furthermore, the thickness of each plate 4 is set to T. In this case, P=2A+2B.

Moreover, FIG. 5 illustrates a V-V cross-sectional view in FIG. 4. In this example (drawing), A=B.

Figure 6:
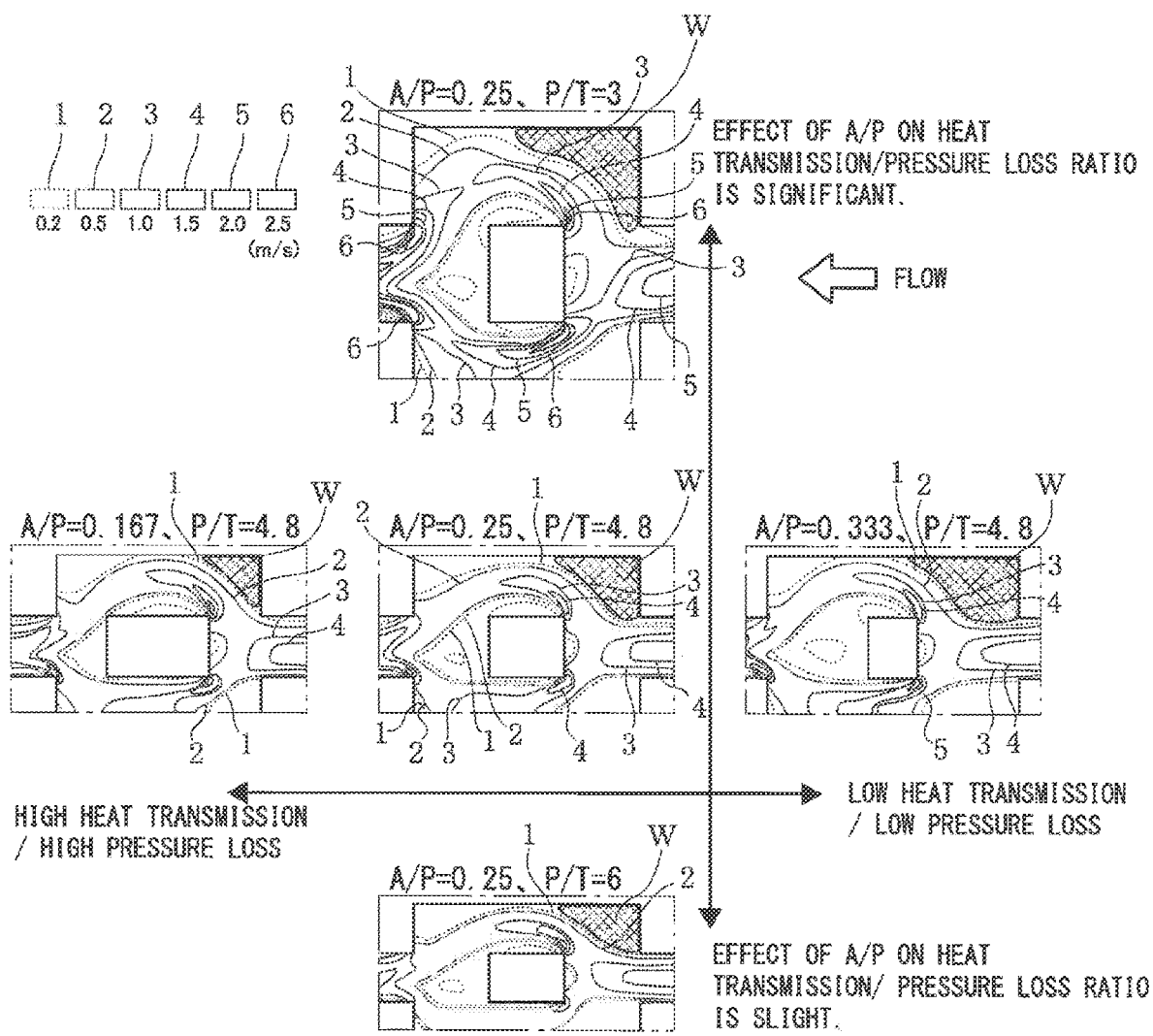
FIG. 6 illustrates a view of a flow rate distribution of a refrigerant when each of A/P and P/T is varied in FIG. 4.

FIG. 6 is a rate contour diagram around a top plate when a refrigerant is caused to circulate in the core of the present invention.

A larger number shown in the drawing shows a faster flow rate. In the view of A/P=0.25, P/T=3.0 in the drawing, the circulation of the refrigerant is shown under the condition of the circulation from the right side (upstream side) to the left side (downstream side) in the drawing, as shown by a white arrow.

In the drawing, three views lying parallel in the lateral direction show a flow rate of the refrigerant when A/P is varied while P/T=4.8, which is constant. The left end view corresponds to the case of A/P=0.167. The central view corresponds to the case of A/P=0.25. The right end view corresponds to the case of A/P=0.333.

A larger A/P value tends to cause a smaller pressure loss in the inside of the core and deterioration of heat exchange performance. As shown in the view in which A/P=0.167, when the value of A/P is small, the rate rises locally due to rapid deviation at the upstream side end surface 3a of the horizontal rib 3. Accompanying to this, a backwater region W generated at the corner of the top plate 6 and the horizontal rib 3 on the upstream side of the flow path becomes smaller as compared with the case of A/P=0.25. Inversely, when the value of A/P is large, as shown in the view in which A/P=0.333, the backwater region W generated at the corner of the top plate and the horizontal rib on the upstream side of the flow path is larger as compared with the case of A/P=0.25.

Moreover, three views aligned in the longitudinal direction in FIG. 6 show the flow rate of the refrigerant when A/P=0.25, which is constant, and P/T is varied. The view on the upper side corresponds to the case of P/T=3. The central view corresponds to the case of P/T=4.8. The view on the lower side corresponds to the case of P/T=6.

It is found that a lager value of P/T causes a slighter effect of A/P on the ratio of heat transmission/pressure loss, and that, as shown in the view in which P/T=6, the backwater region W generated at a corner of the top plate and the horizontal rib on the upstream side of the flow path is smaller as compared with the case of P/T=4.8.

Figure 7:
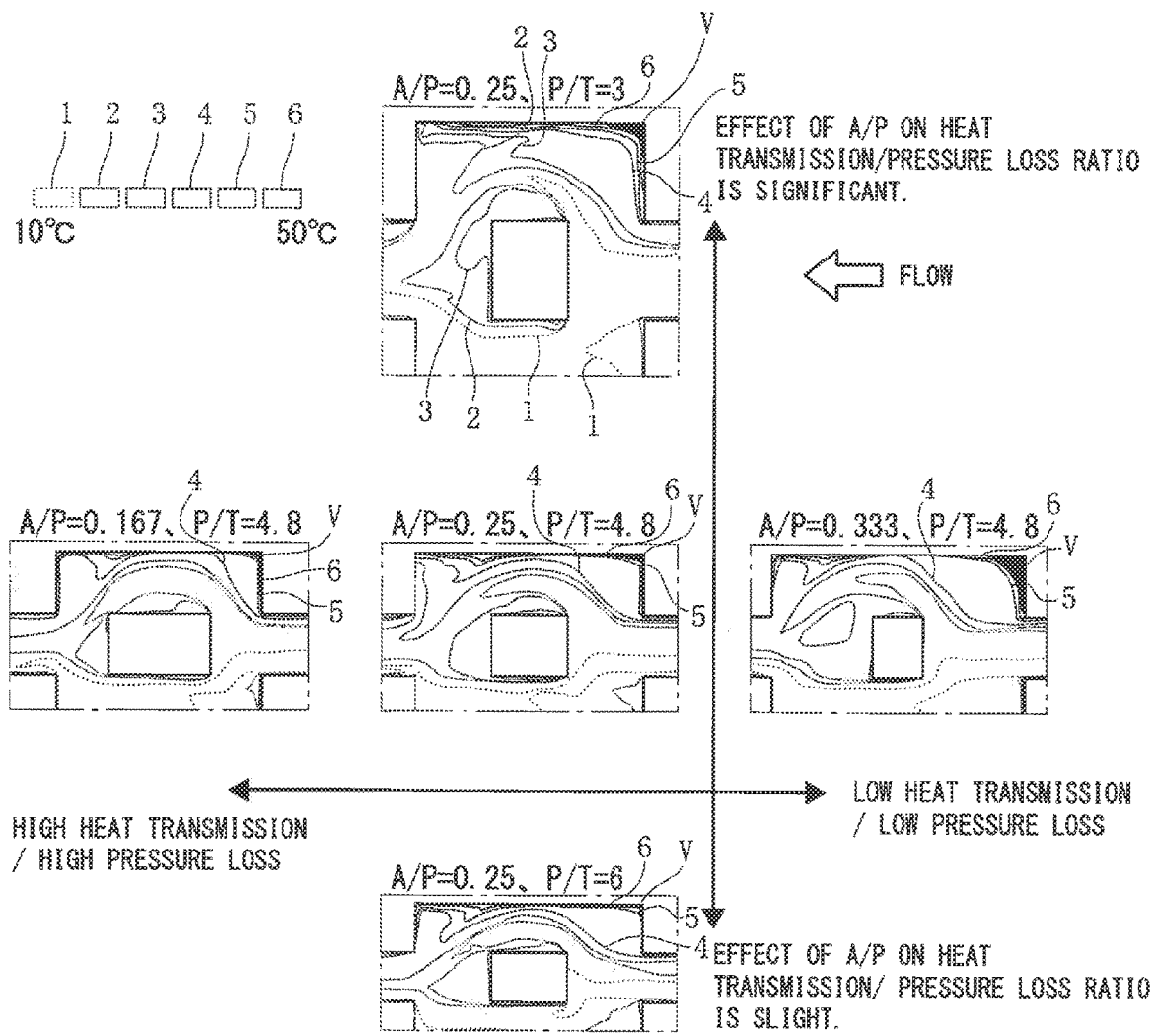
FIG. 7 illustrates a view showing temperature distribution of a refrigerant when each of A/P and P/T is varied in FIG. 4.

Next, FIG. 7 is a temperature contour diagram around the top plate when a refrigerant is caused to circulate in the core of the present invention. A larger number shown in the drawing shows a higher temperature. It is shown under the condition that the flow of the refrigerant circulates from the right side to the left side, in the same way as FIG. 6.

In the drawing, three views standing in a line in the abscissa axis direction show temperature distribution of a refrigerant at respective parts when P/T=4.8, which is constant, and A/P is varied. The left end view corresponds to the case of A/P=0.167. The central view corresponds to the case of A/P=0.25. The right end view corresponds to the case of A/P=0.333.

A larger A/P value tends to cause a smaller pressure loss in the inside of the core and deterioration of the heat exchange performance. As shown in the view in which A/P=0.333, it is found that the thermal boundary layer V generated in a corner of the top plate and the horizontal rib on the upstream side of the flow path is larger as compared with the case of A/P=0.25.

Next, three views aligned in the longitudinal direction in FIG. 7 show the temperature distribution when A/P=0.25, which is constant, and P/T is varied. The view on the upper side corresponds to the case where P/T=3. The central view corresponds to the case where P/T=4.8. The view on the lower side corresponds to the case where P/T=6.

It is found that a lager value of P/T causes a slighter effect of A/P on the ratio of equivalent heat transfer coefficient/ pressure loss, and that, as shown in the view in which P/T=6, a high temperature region (thermal boundary layer V) generated at a corner of the top plate and the horizontal rib on the upstream side of the flow path is smaller as compared with the case where P/T=4.8.

The high temperature region (thermal boundary layer V) shown in FIG. 7 is generated at a position corresponding to the backwater region W in FIG. 6.

As shown in FIG. 6 and FIG. 7, it is necessary to care about setting of numerical values of A/P and P/T so as to suppress generation of the backwater region W and a high temperature region (thermal boundary layer V).

Figure 8:
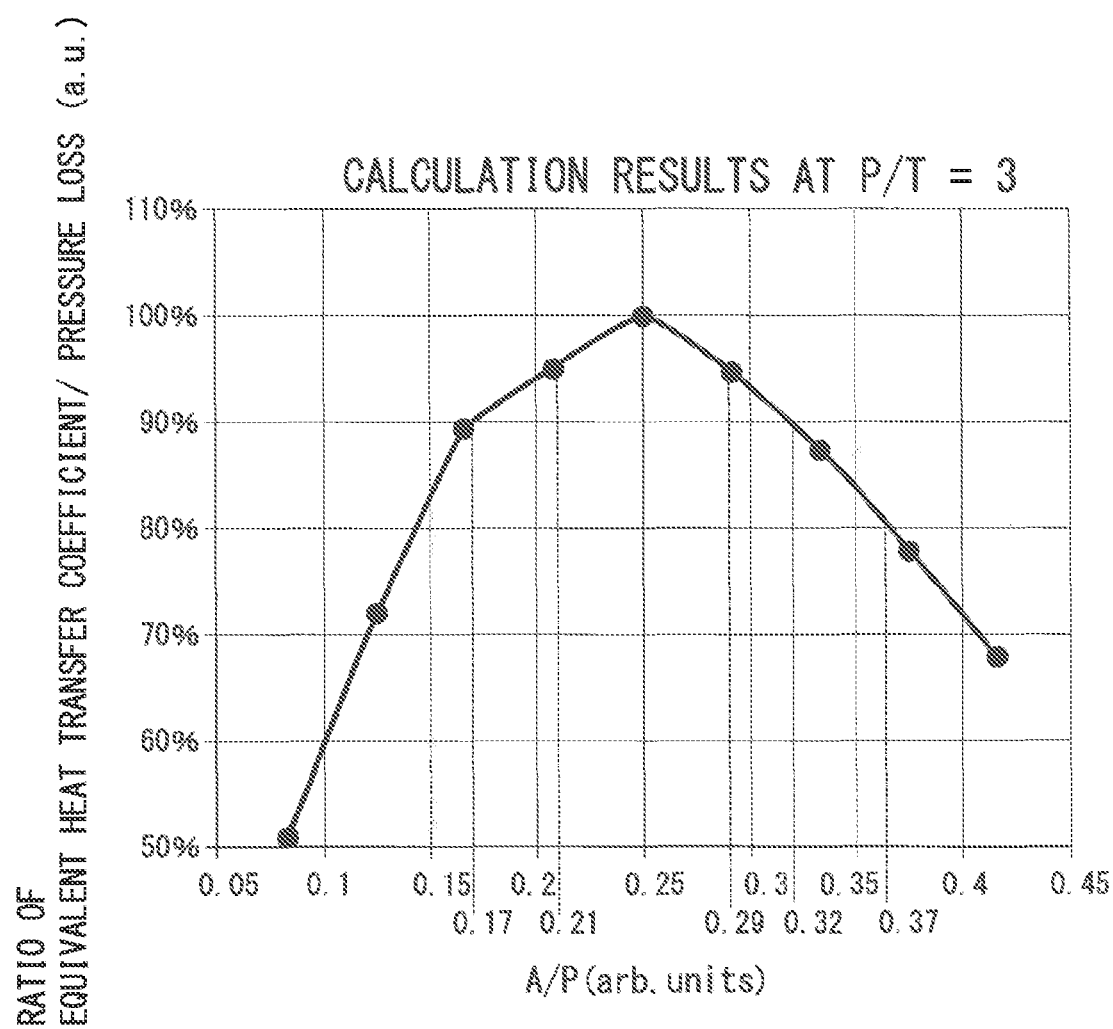
FIG. 8 is a graph showing equivalent heat transfer coefficient/pressure loss relative to A/P at P/T=3.0 (the case where A/P=0.25 is set as 100%).
Figure 9:
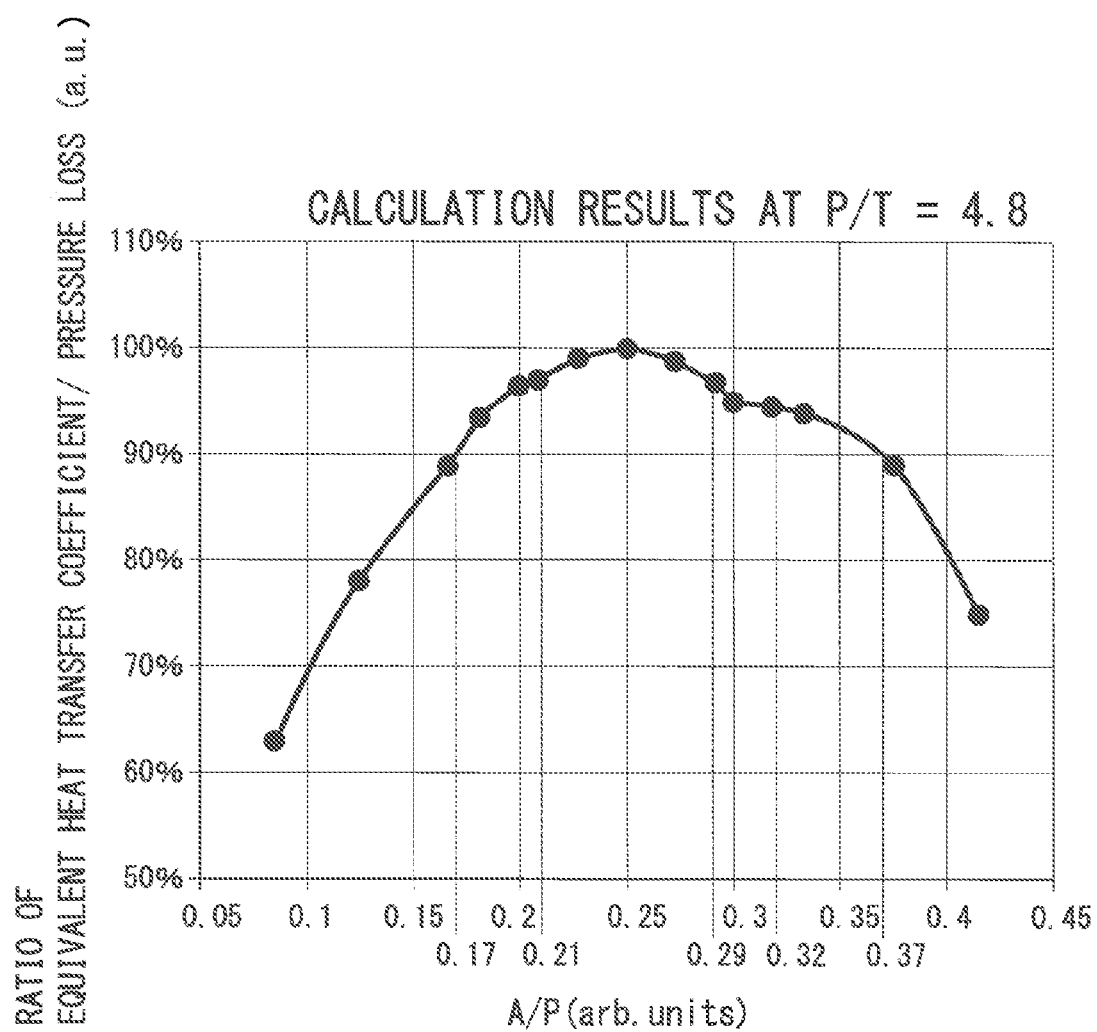
FIG. 9 is a graph showing similarly equivalent heat transfer coefficient/pressure loss at P/T=4.8 (the case where A/P=0.25 is set as 100%).
Figure 10:
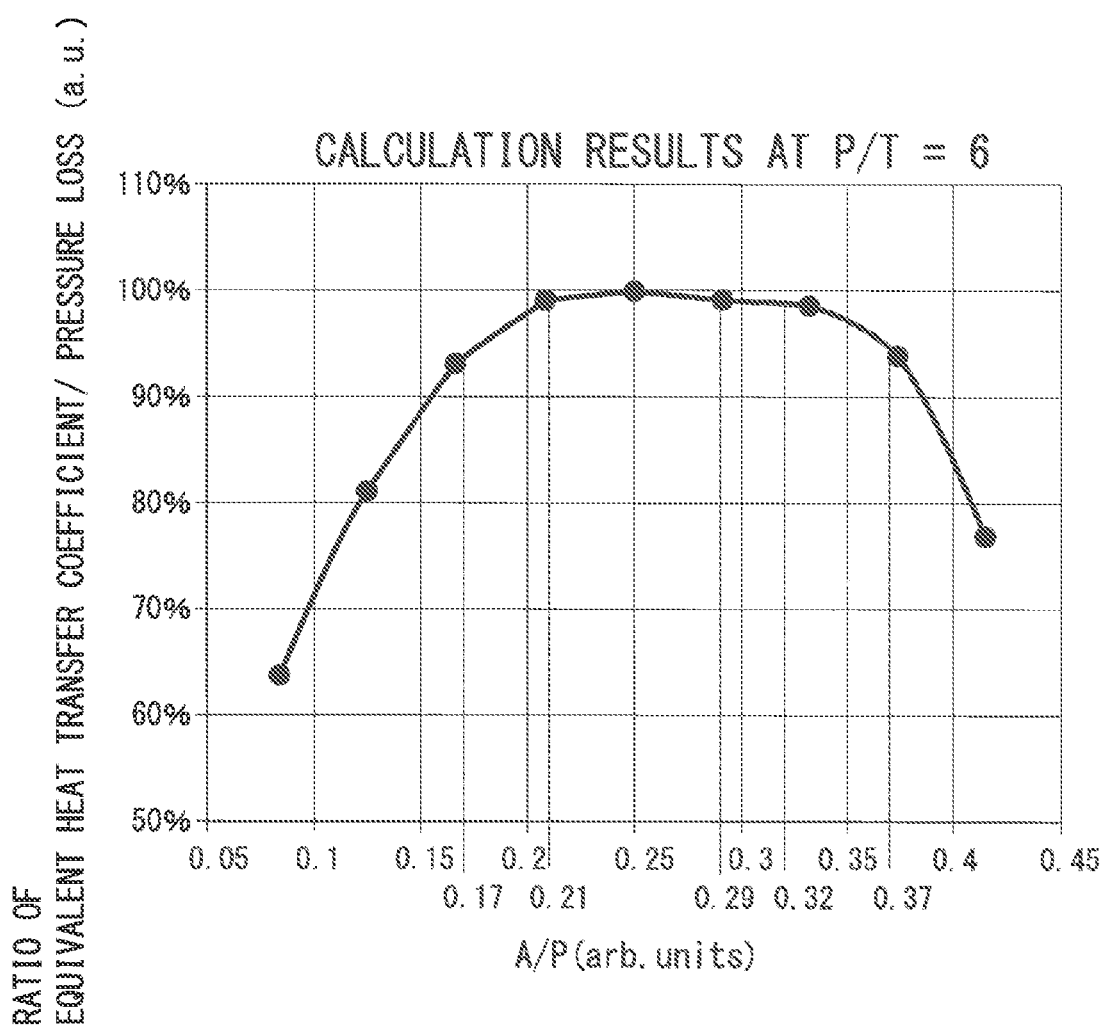
FIG. 10 is a graph showing similarly equivalent heat transfer coefficient/pressure loss at P/T=6.0 (the case where A/P=0.25 is set as 100%).

Accordingly, to find a range of numerical values of A/P, P/T that show the optimum heat exchange performance, the ratio of equivalent heat transfer coefficient/pressure loss relative to the variation of A/P was calculated, which was graphed as FIGS. 8 to 10.

In FIG. 4 and FIG. 5, the case where A=B, that is, A/P=0.25 shows the performance of a core that is considered as ideal (which is defined as the ideal core), and calculation is performed on the basis of the condition of the ideal core. Under this condition, a core of a heat exchanger has the optimized ratio of equivalent heat transfer coefficient/pressure loss to give the core having high heat exchange performance.

FIG. 8 shows calculation results of equivalent heat transfer coefficient/pressure loss at P/T=3, and is a graph in which A/P is given on the abscissa axis and equivalent heat transfer coefficient/pressure loss is given on the ordinate axis. Here, the value of equivalent heat transfer coefficient/pressure loss at A/P=0.25 is set as a basis (100%).

From FIG. 8, when P/T lies in the range of 0.15 to 0.37, the value of equivalent heat transfer coefficient/pressure loss lies in the range of 100 to 80% relative to the ideal core.

FIG. 9 is a graph in which A/P is given on the abscissa axis and equivalent heat transfer coefficient/pressure loss is given on the ordinate axis, at P/T=4.8. In this case, too, when P/T lies in the range of 0.15 to 0.37, the value of equivalent heat transfer coefficient/pressure loss lies in the range of 100 to 80% relative to the ideal core.

FIG. 10 is a graph in which A/P is given on the abscissa axis and equivalent heat transfer coefficient/pressure loss is given on the ordinate axis, at P/T=6. In this case, too, when P/T lies in the range of 0.15 to 0.37, the value of equivalent heat transfer coefficient/pressure loss lies in the range of 100 to 80% relative to the ideal core.

From these results, in each case, by setting A/P in the range of 0.15 to 0.37, a core whose value of equivalent heat transfer coefficient/pressure loss lies in the range of 100 to 80% relative to the ideal core can be obtained.

In the same way, by setting A/P in the range of 0.17 to 0.32, a core whose value of equivalent heat transfer coefficient/pressure loss lies in the range of 100 to 90% relative to the ideal core can be obtained.

Moreover in the same way, by setting A/P in the range of 0.21 to 0.29, a core whose value of equivalent heat transfer coefficient/pressure loss lies in the range of 100 to 95% relative to the ideal core can be obtained.

Example 2

Figure 11:
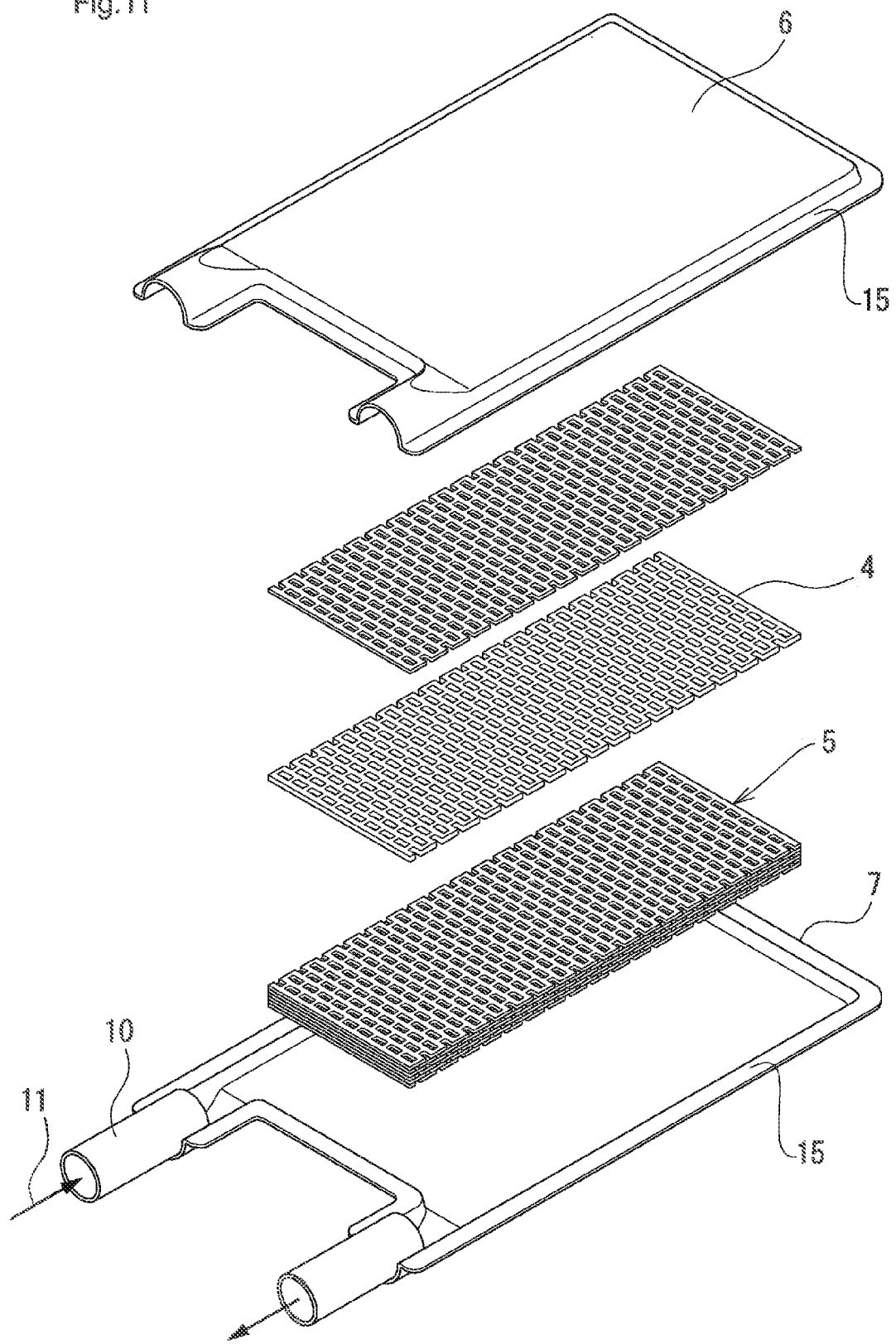
FIG. 11 illustrates an exploded perspective view of a laminated heat sink in Example 2 of the present invention.

FIG. 11 relates to Example 2 of the present invention, and different points of this from the Example 1 are shapes of the top plate 6 and a lower end plate 7, and a shape of each plate 4 forming the core 5. The top plate 6 and the lower end plate 7 are formed in a dish shape having a flange part 15 at an outer periphery, and the core 5 is internally mounted between these. Substantial action and effect are the same as in the Example 1.

REFERENCE SIGNS LIST

1: slit
2: vertical rib
3: horizontal rib
3a: downstream side end surface
3b: upstream side end surface
4: plate
5: core
6: top plate
7: lower end plate
8: inlet
9: outlet
10: pipe
11: refrigerant
12: manifold
13: exothermic body
14: frame part
15: flange part
A: distance
B: width (width of horizontal rib)
T: thickness (plate thickness)
P: pitch
W: backwater region
V: thermal boundary layer

The invention claimed is:

1. A laminated heat sink core, comprising:

a plurality of flat metal plates in a laminated configuration, each of the plates having a plurality of mutually parallel slits formed therethrough to define a plurality of mutually parallel longitudinal ribs and a plurality of mutually parallel transverse ribs, the transverse ribs having a pitch P and each being of a dimension B in a direction of length of the longitudinal ribs, the transverse ribs linking respective adjacent ones of the longitudinal ribs, the longitudinal ribs and the transverse ribs forming the perimeters of the slits, the longitudinal ribs of each of the plates being in registry with the longitudinal ribs of all the other of the plates, the transverse ribs of each plate of a first set of the plates being in registry with the transverse ribs of all the other plates of the first set of plates and the transverse ribs of each plate of a second set of the plates being in registry with the transverse ribs of all the other plates of the second set of plates, the plates of the first and second sets alternating in a direction of lamination of the plates and the transverse ribs of the second set of ribs being out of registry with the transverse ribs of the first set of plates, the transverse ribs of each of the second set of plates being spaced from the transverse ribs of each of the first set of plates in a direction of length of the longitudinal ribs by a distance A, the laminated heat sink core being configured to circulate refrigerant in a direction of length of the longitudinal ribs and through the slits, wherein formulae below are satisfied, where T is the thickness of each of the plates and is 0.8 to 1.6 mm and P, B and A are also expressed in millimeters, P/T=3.0 to 6.0, and A/P=0.15 to 0.37 where P=2A+2B.

2. The laminated heat sink core according to claim 1, wherein A/P=0.17 to 0.32.

3. The laminated heat sink core according to claim 1, wherein A/P=0.21 to 0.29.

* * * * *